(12) United States Patent
Blank et al.

(10) Patent No.: US 9,190,306 B2
(45) Date of Patent: Nov. 17, 2015

(54) DUAL ARM VACUUM ROBOT

(71) Applicant: Lam Research Corporation, Fremont, CA (US)

(72) Inventors: Richard Blank, San Jose, CA (US); Matt McLellan, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 108 days.

(21) Appl. No.: 14/092,240

(22) Filed: Nov. 27, 2013

(65) Prior Publication Data

US 2014/0154033 A1 Jun. 5, 2014

Related U.S. Application Data

(60) Provisional application No. 61/731,755, filed on Nov. 30, 2012.

(51) Int. Cl.
*H01L 21/67* (2006.01)
*H01L 21/677* (2006.01)
*B25J 11/00* (2006.01)
*B25J 9/04* (2006.01)

(52) U.S. Cl.
CPC .......... *H01L 21/67742* (2013.01); *B25J 9/042* (2013.01); *B25J 11/0095* (2013.01)

(58) Field of Classification Search
CPC ........ B25J 9/042; B25J 9/043; B25J 11/0095; B25J 18/04; H01L 21/67742; H01L 21/67739
USPC .................................................. 414/744.5
See application file for complete search history.

(56) References Cited

U.S. PATENT DOCUMENTS

| 5,151,008 A * | 9/1992 | Ishida et al. ............... 414/744.5 |
| 6,742,977 B1 * | 6/2004 | Okayama et al. ............. 414/217 |
| 8,961,099 B2 * | 2/2015 | Blank et al. ................ 414/744.5 |
| 2002/0066330 A1 | 6/2002 | Namba et al. |
| 2004/0001750 A1 | 1/2004 | Kremerman |
| 2006/0099063 A1 * | 5/2006 | Pietrantonio et al. ...... 414/744.5 |
| 2011/0135437 A1 * | 6/2011 | Takeshita et al. .......... 414/744.5 |
| 2013/0272823 A1 * | 10/2013 | Hudgens et al. ............. 414/217 |
| 2014/0271050 A1 * | 9/2014 | Weaver et al. ................ 414/217 |
| 2014/0271055 A1 * | 9/2014 | Weaver et al. ................ 414/221 |
| 2014/0348618 A1 * | 11/2014 | Blank ........................... 414/217 |

FOREIGN PATENT DOCUMENTS

| WO | WO2005/123656 | 12/2005 |
| WO | WO2012/064949 | 5/2012 |

OTHER PUBLICATIONS

Search and Examination Report for corresponding Singapore Application No. 2013089982 dated Dec. 18, 2014; 22 pages.

* cited by examiner

*Primary Examiner* — Kaitlin Joerger (57) ABSTRACT

A dual arm robot for a substrate processing system includes a base and a first arm having extended and retracted positions. Each of the first and second arms includes a first arm portion having one end rotatably connected to the base, a second arm portion having one end rotatably connected to another end of the first arm portion, and an end effector having one end rotatably connected to another end of the second arm portion and another end configured to support first and second substrates, respectively. When the first and second arms are arranged in the retracted position, connections between the second arm portions and the end effectors are located over or under the second and first substrates, respectively, and the first substrate is not located over or under the second substrate.

14 Claims, 7 Drawing Sheets

DUAL ARM VACUUM ROBOT

CROSS-REFERENCE TO RELATED APPLICATIONS

This application claims the benefit of U.S. Provisional Application No. 61/731,755, filed Nov. 30, 2012. The entire disclosure of the application referenced above is incorporated herein by reference.

FIELD

The present disclosure relates to robots and more specifically to dual arm robots used in substrate processing systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Different types of tools are used to perform processing operations on substrates such as semiconductor wafers. The processing chambers may be arranged about a central hub. The central hub and the processing chambers may be kept at low pressure.

Substrates may be introduced into the processing chambers by substrate handling systems. The substrate handling systems transfer the substrates from a factory floor to the processing chamber. The substrate handling systems may include load locks to bring the substrates from atmospheric conditions to the low pressure conditions and back. Robots are often used to transfer the substrates. Substrate handling systems may utilize robots that operate at ambient conditions and at low pressure. Throughput, which refers to the number of substrates that are processed in a period of time, is affected by the process time, the number of wafers that are processed at a time, as well as timing of the steps to introduce the wafers into the vacuum processing chambers.

SUMMARY

A dual arm robot for a substrate processing system includes a base and a first arm having extended and retracted positions. The first arm includes a first arm portion having one end rotatably connected to the base, a second arm portion having one end rotatably connected to another end of the first arm portion, and an end effector having one end rotatably connected to another end of the second arm portion and another end configured to support a first substrate. A second arm has extended and retracted positions. The second arm includes a first arm portion having one end rotatably connected to the base, a second arm portion having one end rotatably connected to another end of the first arm portion, and an end effector having one end rotatably connected to another end of the second arm portion and another end configured to support a second substrate. When the first and second arms are arranged in the retracted position, a connection between the second arm portion of the first arm and the end effector of the first arm is located over the second substrate, a connection between the second arm portion of the second arm and the end effector of the second arm is located under the first substrate, and the first substrate is not located over the second substrate.

In other features, the first substrate does not pass over the second substrate as at least one of the first arm or the second arm moves between the retracted position and the extended position.

In other features, when the first arm portion of the first arm and the first arm portion of the second arm are in the retracted position, (i) the first arm portion of the first arm and the first arm portion of the second arm are co-linear, and (ii) circumferential outer edges of the first substrate and the second substrate are located within a circle defined by radially outermost portions of the first arm portion of the first arm and the first arm portion of the second arm.

In other features, a drive mechanism is configured to couple rotation of the first arm portion of the first arm relative to the base in a first rotational direction to rotation of (i) the second arm portion of the first arm relative to the first arm portion of the first arm in a second rotational direction opposite to the first rotational direction and (ii) rotation of the end effector of the first arm relative to the second arm portion of the first arm in the first rotational direction.

In other features, the drive mechanism is further configured to couple rotation of the first arm portion of the second arm relative to the base in the second rotational direction to rotation of (i) the second arm portion of the second arm relative to the first arm portion of the second arm in the first rotational direction and (ii) rotation of the end effector of the second arm relative to the second arm portion of the second arm in the second rotational direction.

In other features, the drive mechanism includes a first motor, a second motor and a common motor. Rotation of the first motor extends and retracts the first and second arms relative to the base, rotation of the first motor and the second motor allows extension and retraction of the first arm or the second arm relative to the base, and rotation of the common motor rotates the first arm and the second arm relative to the base without extension or retraction.

In other features, the drive mechanism includes one or more pulleys and one or more drive belts to rotationally couple rotation of the first arm portion of the first arm, the second arm portion of the first arm and the end effector of the first arm and rotationally couple rotation of the first arm portion of the second arm, the second arm portion of the second arm and the end effector of the second arm.

In other features, when the drive mechanism rotates the first arm portion of the first arm by a first angle relative to the base, the drive mechanism (i) rotates the second arm portion of the first arm by a second angle relative to the first arm portion of the first arm and (ii) rotates the end effector of the first arm by a third angle relative to the second arm portion of the first arm. A magnitude of the first angle is greater than a magnitude of the second angle, and the magnitude of the second angle is greater than a magnitude of the third angle. The magnitude of the second angle is one half of the magnitude of the first angle and the magnitude of the third angle is one half of the magnitude of the second angle.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
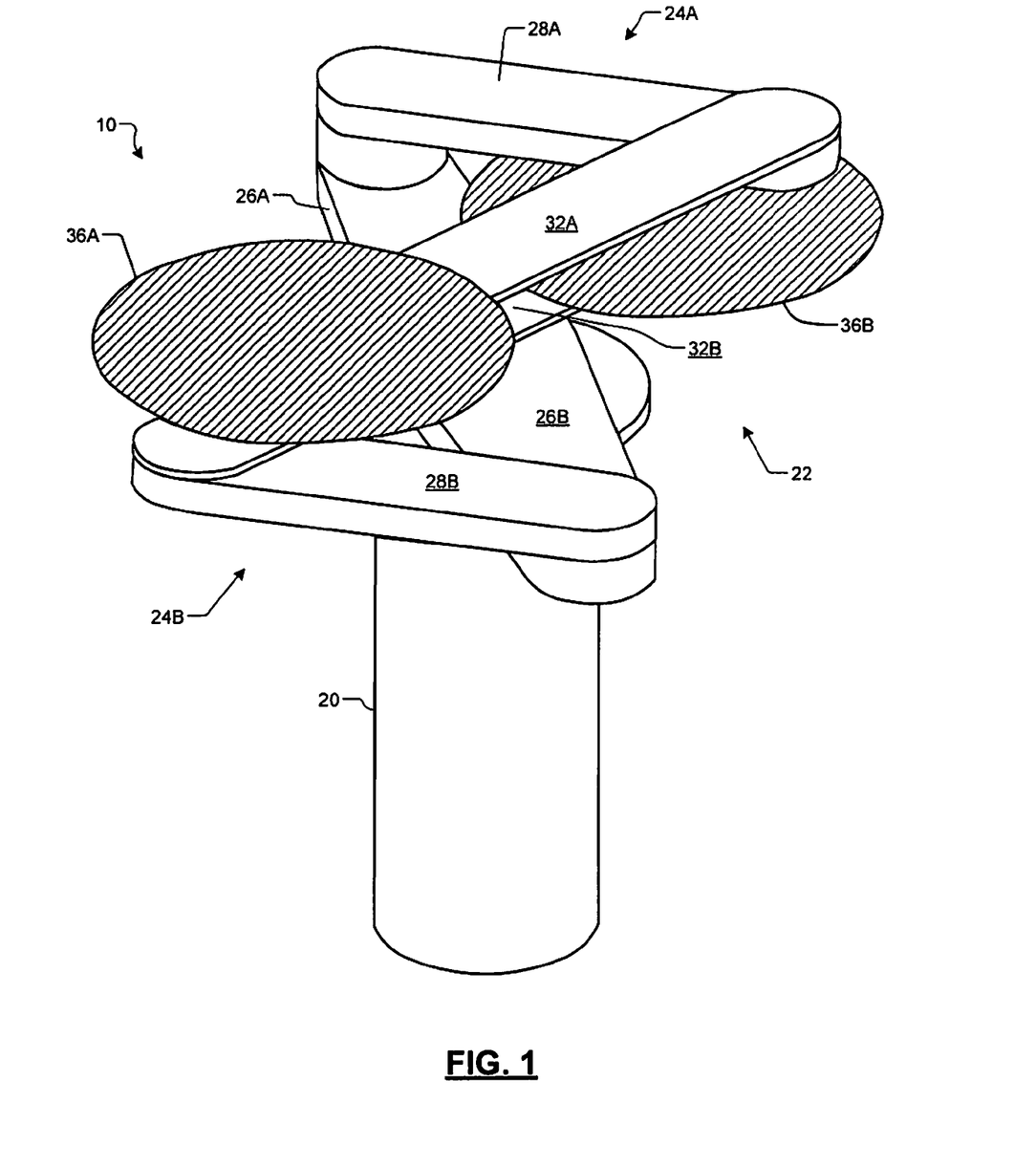
FIG. 1 is a perspective view of a robot according to the present disclosure.

Referring now to FIG. 1, a robot 10 includes a base 20 and an arm assembly 22 including a first arm 24A and second arm 24B. The first arm 24A includes a first arm portion 26A rotatably connected to the base 20, a second arm portion 28A rotatably connected to the first arm portion 26A and an end effector 32A rotatably connected to the second arm portion 28A. A substrate 36A such as a semiconductor wafer is shown positioned on the end effector 32A.

The second arm 24B is similar to the first arm 24A. The second arm 24B includes a first arm portion 26B rotatably connected to the base 20, a second arm portion 28B rotatably connected to the first arm portion 26B and an end effector 32B rotatably connected to the second arm portion 28B. A substrate 36B such as a semiconductor wafer is shown positioned on the end effector 32B. The end effectors 32A and 32B extend from the base 20 in substantially opposite directions.

In FIG. 1, the end effector 32A, the substrate 36A and the second arm portion 28A (associated with the first arm 24A) are arranged above the end effector 32B, the substrate 36B and the second arm portion 28B (associated with the second arm 24B). The end effector 32B and the substrate 36B (associated with the second arm 24B) are arranged above the first arm portion 26A of the first arm 24A.

Figure 2:
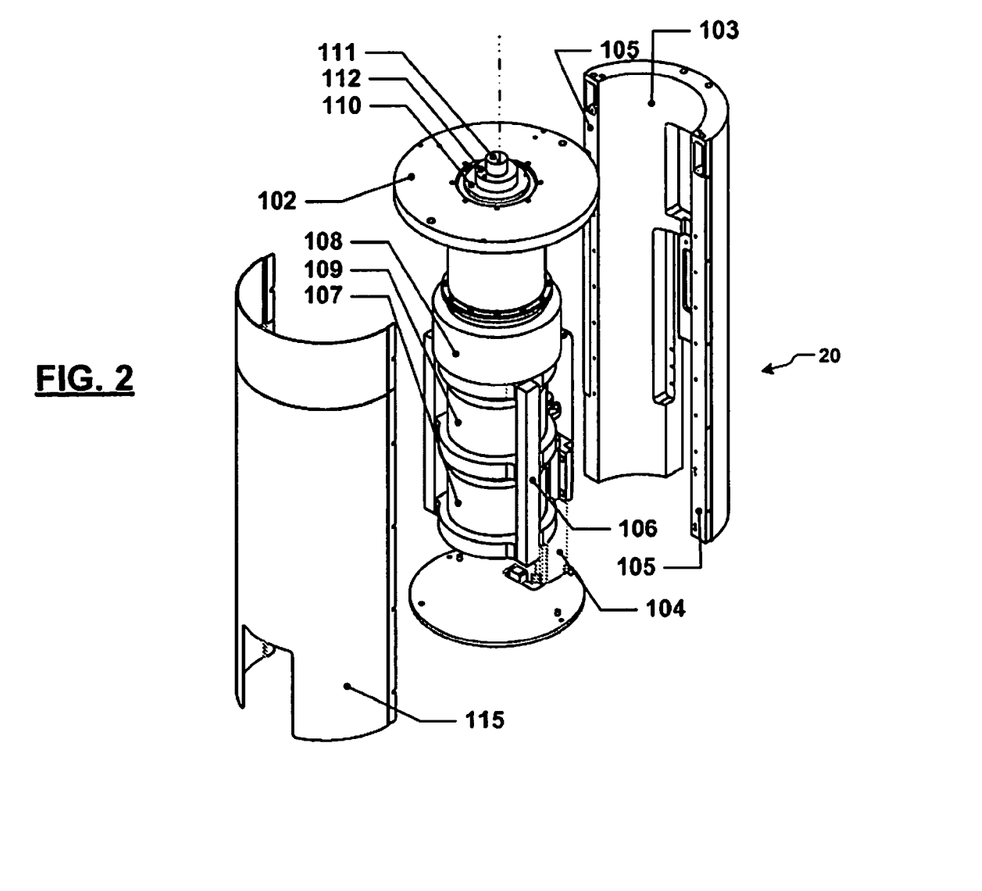
FIG. 2 is an exploded perspective view of a base of the robot according to the present disclosure.

Referring now to FIG. 2, the base 20 may include a base plate 102, which may be used to mount the robot 10 within a processing chamber or tool. A support structure 103 may be rigidly connected with the base plate 102 and may be used to provide support to the arm assembly 22, as well as other components within the base 20.

The support structure 103 may, for example, be rigidly connected with rails (not shown) along face 105, which may allow for z-axis or vertical movement of a motor support 106. The motor support 106 may include glides or other hardware which may be slidably engaged with the rails and that may prevent the motor support 106 from moving in directions other than along the z-axis. The motor support 106 may be moved in the z-axis direction by a z-axis drive 104. The z-axis drive 104 may be, for example, a linear drive assembly using a lead screw driven by a rotational motor (both not shown). The motor support 106 may support a first drive motor 107, a second drive motor 108, and a common drive motor 109. The first drive motor 107, the second drive motor 108, and the common drive motor 109 may be similar or different motors.

The base 20 may also include a first drive shaft 110, a second drive shaft 111, and a common drive shaft 112. The first drive shaft 110 may be rotationally driven by the first drive motor 107. The second drive shaft 111 may be rotationally driven by the second drive motor 108. The common drive shaft 112 may be rotationally driven by the common drive motor 109. The first drive shaft 110, the second drive shaft 111, and the common drive shaft 112 may be coaxially arranged and may all rotate about the same axis.

The first drive shaft 110, the second drive shaft 111, and the common drive shaft 112 may all pass through a tri-axial ferro-fluidic seal (not shown). The tri-axial ferro-fluidic seal allows for three independently driven axles to pass through the seal without loss of seal integrity. This allows the majority of the base 20 to be operated in an environment different from the low pressure environments observed in the hub or the processing chambers and within which the arm assembly 22 will function. A base cover 115 may be attached to the base 20 to prevent damage to the internal components of the base 20. While a ferro-fluidic seal is used in this implementation, other types of seals may be used in place of, or in addition to, a ferro-fluidic seal, such as a magnetic coupling or a friction seal.

While the base 20 depicts a drive system where the first drive motor 107, the second drive motor 108, the common drive motor 109, the first drive shaft 110, the second drive shaft 111, and the common drive shaft 112 are all coaxial with each other, the drive shafts may each be directly coupled to their respective drive motors and the first drive motor 107, the second drive motor 108, and the common drive motor 109 need not be coaxial with each other. In such an arrangement, the drive motors may be coupled to their respective drive shafts via belts or other drive mechanism.

Figure 3:
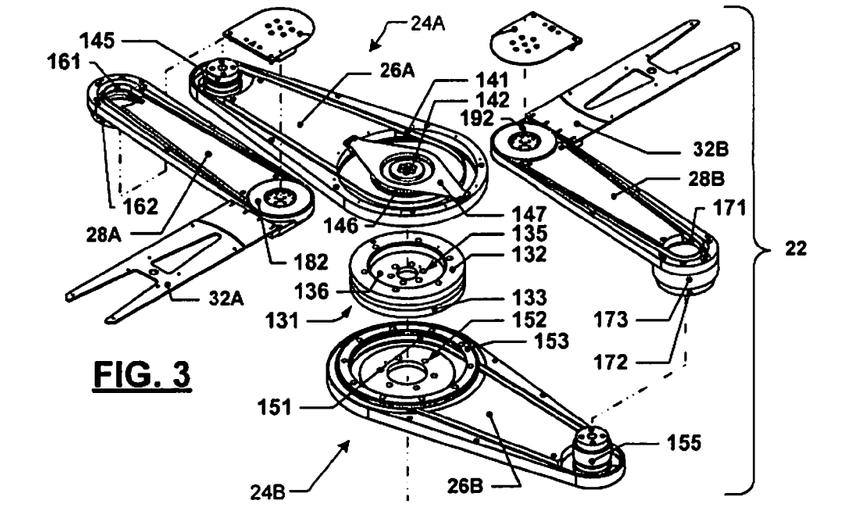
FIG. 3 is an exploded perspective view of an arm assembly of the robot according to the present disclosure.

Referring now to FIG. 3, the arm assembly 22 may include the first arm 24A and the second arm 24B. The first arm 24A and the second arm 24B may operate in a similar manner and utilize many common components, although the two arms may differ slightly in construction to allow for operating clearances and particular arm assembly configurations. The first arm 24A may include the first arm portion 26A, the second arm portion 28A, and the end effector 32A. The second arm 24B may include the first arm portion 26B, the second arm portion 28B, and the end effector 32B. The end effectors 32A and 32B can be any type of end effectors including paddles, forks, grippers, and the like. In some implementations, the robot 10 may be provided without end effectors, but with interfaces which accept end effectors, to a customer.

One end of the first arm portion 26A may be rigidly coupled with the first drive shaft 110 such that when the first drive shaft 110 is rotated by the first drive motor 107, the first arm portion 26A rotates with respect to the base 20 about the rotational axis of the first drive shaft 110. For example, a plate with an first drive shaft hole pattern 142 may be bolted to the first drive shaft 110 and joined to a load transfer plate 147 via an upper first arm bellows coupling 146. This allows for a substantially rigid rotational coupling between the first drive shaft 110 and the first arm portion 26A while still allowing for minor axial misalignments during assembly. The other end of the first arm portion 26A may be rotationally coupled with one end of the second arm portion 28A. The other end of the second arm portion 28A may, in turn, be rotationally coupled with the end effector 32A.

Similarly, one end of the first arm portion 26B may be rigidly coupled with the second drive shaft 111 such that when the second drive shaft 111 is rotated by the second drive motor 108, the first arm portion 26B rotates with respect to the base 20 about the rotational axis of the second drive shaft 111. For example, the first arm portion 26B may be bolted to the second drive shaft via second drive shaft hole pattern 152. The other end of the first arm portion 26B may be rotationally coupled with one end of the second arm portion 28B. The other end of the second arm portion 28B may, in turn, be rotationally coupled with the end effector 32B.

The first arm portion 26A and the first arm portion 26B may also be rotationally coupled with each other via an upper arm bearing 153. The rotational axis of the upper arm bearing 153 may be substantially coaxial with the rotational axes of the first drive shaft 110 and the second drive shaft 111.

The first arm portion 26A of the first arm 24A and the first arm portion 26B of the second arm 24B may both rotate about a common drive pulley assembly 131, which may be housed between a first recess in the first arm portion 26A and a similar first recess in the first arm portion 26B. The common drive pulley assembly 131 may rotate about an axis substantially coaxial with the rotational axes of the first drive shaft and the second drive shaft with respect to the first arm portion 26A and the first arm portion 26B. The common drive pulley assembly may include a common drive plate 136 with a common drive shaft hole pattern 135. The common drive shaft hole pattern 135 may be configured to allow the common drive plate 136 to be rigidly connected with the common drive shaft 112 such that rotation of the common drive shaft 112 causes the common drive pulley assembly 131 to rotate about the rotational axis of the common drive shaft 112.

The common drive pulley assembly 131 may also include a first common drive pulley 132 and a second common drive pulley 133, which are rigidly connected with the common drive plate 136.

The second arm portion 28A may include a driven pulley 162, which, when the second arm portion 28A is rotatably connected with the first arm portion 26A, protrudes into a second recess in the first arm portion 26A. The driven pulley 162 may be rigidly connected with the second arm portion 28A. In some examples, a first ratio of the diameter of the common drive pulley 132 to the diameter of the driven pulley 162 may be in the range from 0.25:1 to 2:1. In other examples, the first ratio is (less than 1):1. When the diameter of the common drive pulley 132 is less than the diameter of the driven pulley 162 and two motors (e.g. the common motor and the first or second motor) are used to move an arm, the torque load on each motor is reduced.

A drive belt 141 may be stretched over both the driven pulley 162 and the common drive pulley 132. The drive belt 141 may be made from steel or some other material with a relatively high tensile elasticity, such as 301 high-yield stainless steel. Various belt tensioning systems may be employed to help eliminate rotational slop between the common drive pulley 132 and the driven pulley 162. A pair of channels connecting the first recess and the second recess of the first arm portion 26A allows the drive belt 141 to span between the common drive pulley 132 and the driven pulley 162.

For example, assuming that the first ratio is 0.5:1, when the first arm portion 26A is rotated through an angle 2X with respect to the common drive pulley assembly 131 and, consequently, common drive pulley 132, this causes the drive belt to circulate within the first recess and the second recess of the first arm portion 26A, as well as the channels connecting those recesses, and also causes the driven pulley 162 to be rotated with respect to the first arm portion 26A. Due to the 0.5:1 diameter ratio between the common drive pulley 132 and the driven pulley 162 in this example, the driven pulley 162, as well as the second arm portion 28A rigidly connected with the driven pulley 162, may be rotated through an angle of X and in the opposite direction of the rotation of the first arm portion 26A by the movement of the drive belt 141. As can be appreciated, other ratios may be used.

The end effector 32A, as mentioned above, may be rotationally coupled with the end of the second arm portion 28A opposite the end of the second arm portion 28A featuring the driven pulley 162. The end effector 32A may include an end effector driven pulley 182 (under a cover plate [181] in use) which is rigidly connected with the end effector 32A, i.e., rotation of the end effector driven pulley with respect to the second arm portion 28A causes the end effector 32A to rotate with respect to the second arm portion 28A as well. A drive belt 161 may be stretched over the end effector driven pulley 182 and a drive pulley 145. The drive pulley 145 may be rigidly connected with the first arm portion 26A, and may be approximately one half the diameter of the end effector driven pulley 182, although other ratios may be used. The drive belt may be made from material similar to that used for the drive belt 141.

When the second arm portion 28A is rotated through an angle Y with respect to the first arm portion 26A, which consequently causes the drive pulley 145 to rotate with respect to the second arm portion 28A, this causes the drive belt 161 to circulate within the second arm portion 28A and also causes the end effector driven pulley 182 to be rotated with respect to the second arm portion 28A through, in this example, an angle of ½Y and in the opposite direction of the rotation of the second arm portion 28A.

Because the end effector 32A, the second arm portion 28A, and the first arm portion 26A may be linked with each other by the various pulleys and belts described above, rotating the first arm portion 26A through an angle 2X with respect to common drive pulley 132 may cause the second arm portion 28A to rotate through an angle of −X with respect to the first arm portion 26A, and to cause the end effector 32A to rotate through an angle of ½ X with respect to second arm portion 28A. For example, if the first arm portion 26A is rotated by 60° in a first direction, the second arm portion 28A would rotate 30° in a second or opposite direction with respect to the first arm portion 26A, and the end effector 32A would rotate 15° in the first direction with respect to the second arm portion 28A. As can be appreciated, other ratios may be used.

The second arm 24B is constructed in a manner very similar to the manner in which the first arm 24A is constructed, although with some differences. The second arm portion 28B may include a driven pulley 172, which, when the second arm portion 28B is rotatably connected with the first arm portion 26B, protrudes into a second recess in the first arm portion 26B. The driven pulley 172 may be rigidly connected with the second arm portion 28B via a spacer 173, which may offset the second arm portion 28B from the first arm portion 26B sufficiently far enough to cause the second arm portion 28B and the second arm portion 28A to be co-planar. A drive belt 151 may be stretched over both the driven pulley 172 and the common drive pulley 133. The drive belt 151 may be made from material similar to that used for the drive belt 141. A pair of channels connecting the first recess and the second recess of the first arm portion 26B allows the drive belt 151 to span between the common drive pulley 132 and the driven pulley 172.

When the first arm portion 26B is rotated through an angle 2X with respect to the common drive pulley assembly 131 and, consequently, common drive pulley 132, this causes the drive belt to circulate within the first recess and the second recess of the first arm portion 26B, as well as the channels connecting those recesses, and also causes the driven pulley 172 to be rotated with respect to the first arm portion 26B. Due to the 0.5:1 diameter ratio between the common drive pulley 132 and the driven pulley 172 in this example, the driven pulley 172, as well as the second arm portion 28B rigidly connected with the driven pulley 172, may be rotated through an angle of X and in the opposite direction of the rotation of the first arm portion 26B by the movement of the drive belt 151.

The end effector 32B, as mentioned above, may be rotationally coupled with the end of the second arm portion 28B opposite the end of the second arm portion 28B featuring the driven pulley 172. The end effector 32B may include a driven pulley 192 (under a cover plate 191 in use) which is rigidly connected with the end effector 32B, i.e., rotation of the driven pulley with respect to the second arm portion 28B causes the end effector 32B to rotate with respect to the second arm portion 28B as well. Drive belt 171 may be stretched over the driven pulley 192 and an drive pulley 155. The drive pulley 155 may be rigidly connected with the first arm portion 26B, and may be approximately one half the diameter of the driven pulley 192.

When the second arm portion 28B is rotated through an angle Y with respect to the first arm portion 26B, which consequently causes the drive pulley 155 to rotate with respect to the second arm portion 28B, this causes drive belt 171 to circulate within the second arm portion 28B and also causes the driven pulley 192 to be rotated with respect to the second arm portion 28B through, in this example, an angle of ½ Y and in the opposite direction of the rotation of the second arm portion 28B.

Because the end effector 32B, the second arm portion 28B, and the first arm portion 26B may be linked with each other by the various pulleys and belts described above, rotating the first arm portion 26B through an angle 2X with respect to common drive pulley 132 may cause the second arm portion 28B to rotate through an angle of –X with respect to the first arm portion 26B, and to cause the end effector 32B to rotate through an angle of ½ X with respect to second arm portion 28B. For example, if the first arm portion 26B is rotated by 60° in a first direction, the second arm portion 28B would rotate 30° in a second or opposite direction with respect to the first arm portion 26B, and the end effector 32B would rotate 15° in the first direction with respect to the second arm portion 28B. As can be appreciated, other ratios may be used.

While the preceding examples describe movement using the first or second motor, the common motor may also be rotated at the same time. When the common motor is rotated in the same direction as the first or second motor, the pulleys will be driven by an amount that adds to the rotation caused by rotation of the first motor. In the preceding example, if the common motor is rotated 15° and the first arm is rotated 60°, the second arm will rotate an additional 30° in the second direction (for a total of –60°) and the end effector will rotate an additional 15° in the first direction. As can be appreciated, when moving the first arm, the first motor may be used alone or in conjunction with the common motor. The first motor and the common motor may be turned on and off during the movement to effectuate different types of movement of the first arm. The second motor may be rotated in the opposite direction to keep the second arm in the same position. Still other variations are contemplated.

Figure 4:
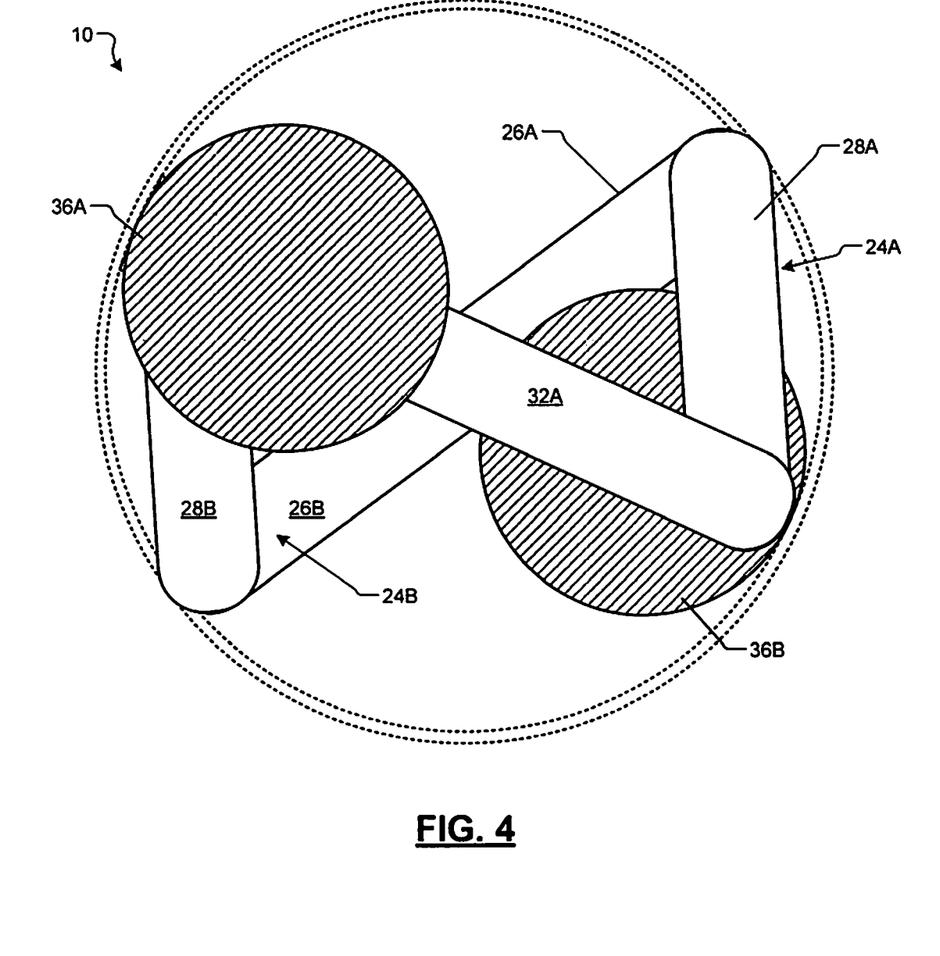
FIGS. 4-7 are plan views illustrating the arm assembly of the robot in a fully retracted position, partially extended positions, and a fully extended position.

Referring now to FIG. 4-7, the arm assembly 22 is shown in different positions. In FIG. 4, the first and second arms 24A and 24B are arranged in a fully retracted position. The substrates 36A and 36B are spaced apart. In other words, the substrate 36A is not located over the substrate 36B. The arms 24A and 24B and the substrates 36A and 36B are located in a very compact arrangement. The substrates 36A and 36B may have a first diameter. Outer edges of arms 24A and 24B are located within a second diameter 210 (as can be seen at 220 and 222). Outer edges of substrates 36A and 36B are located within a third diameter 230 as can be seen at 240 and 242.

Figure 5:
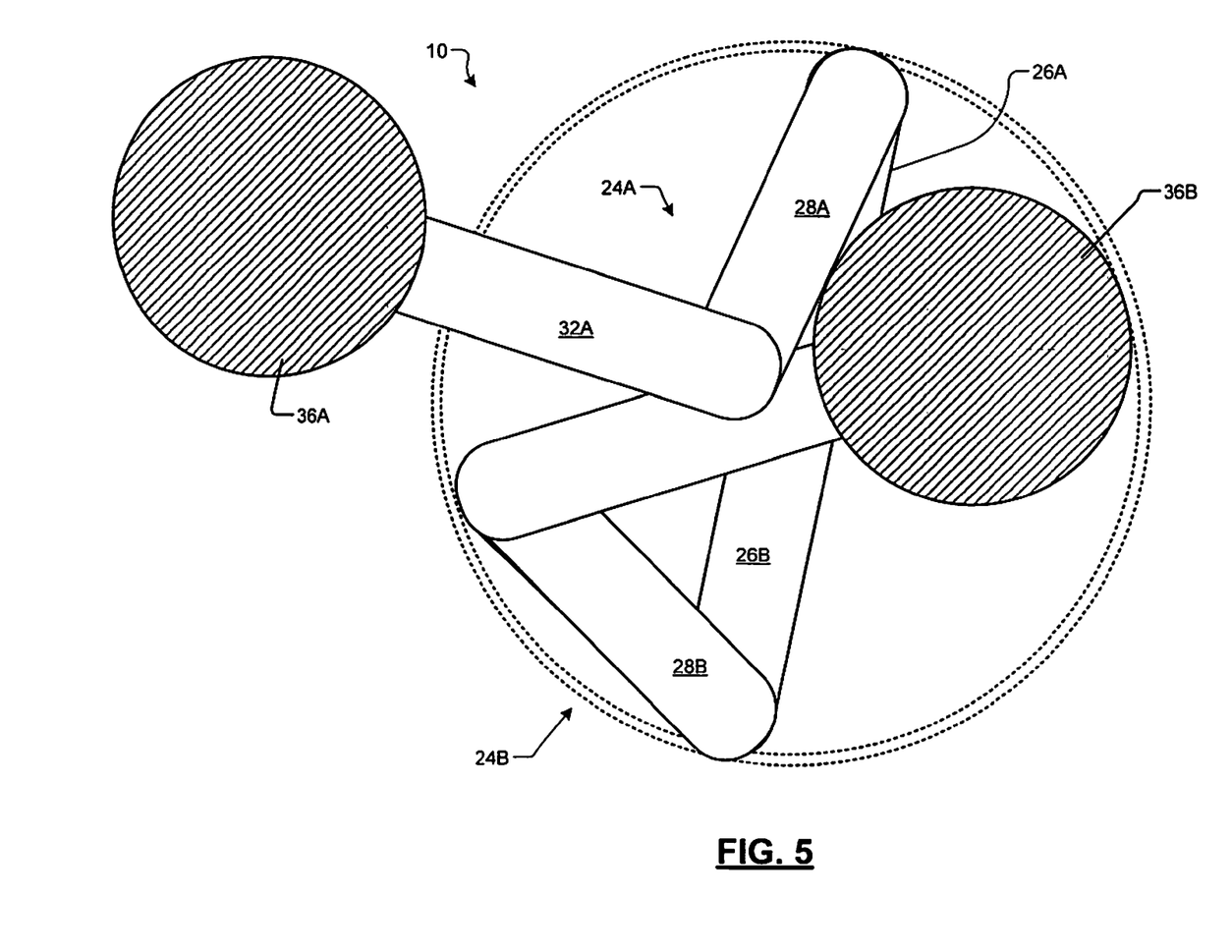
Figure 6:
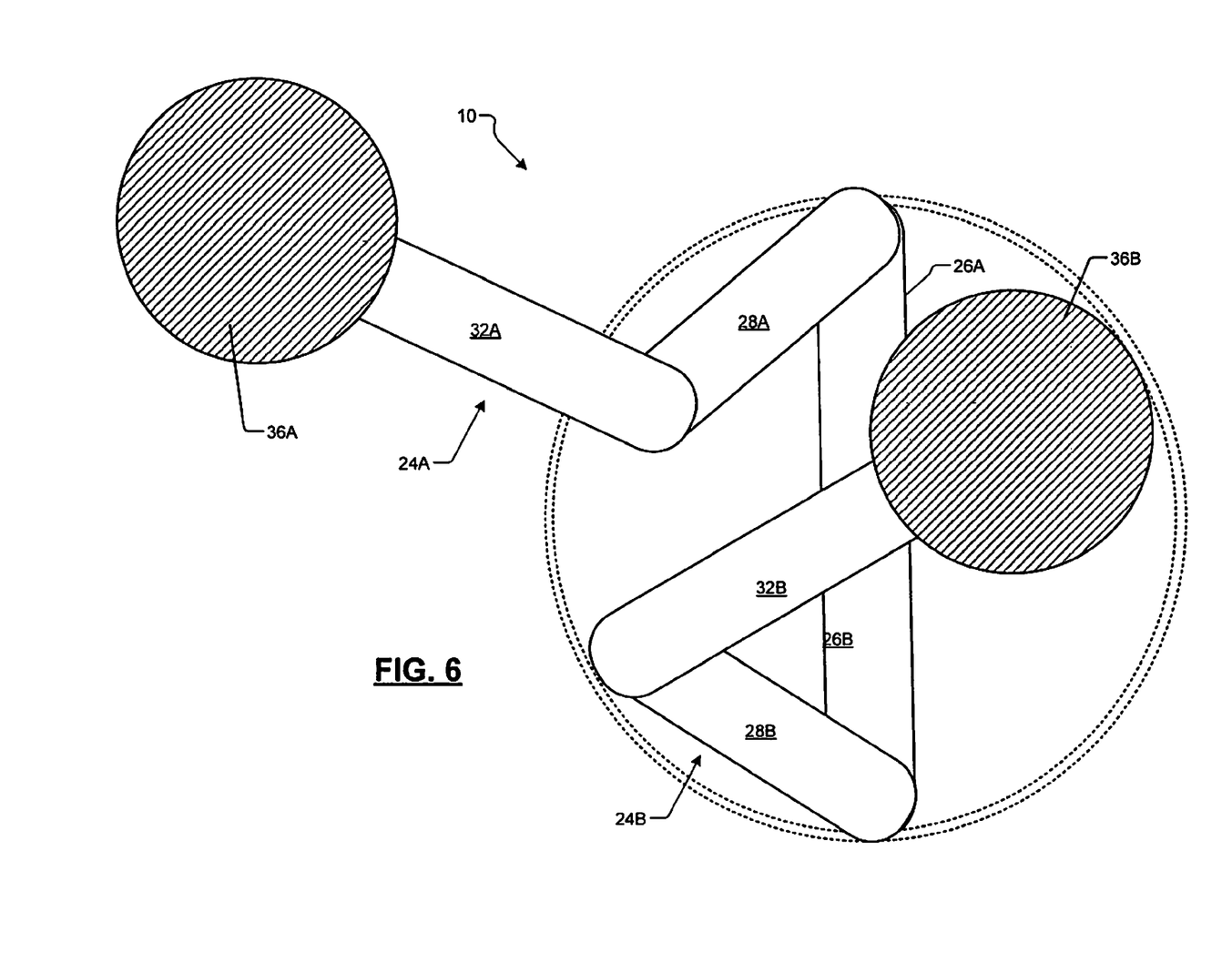
Figure 7:
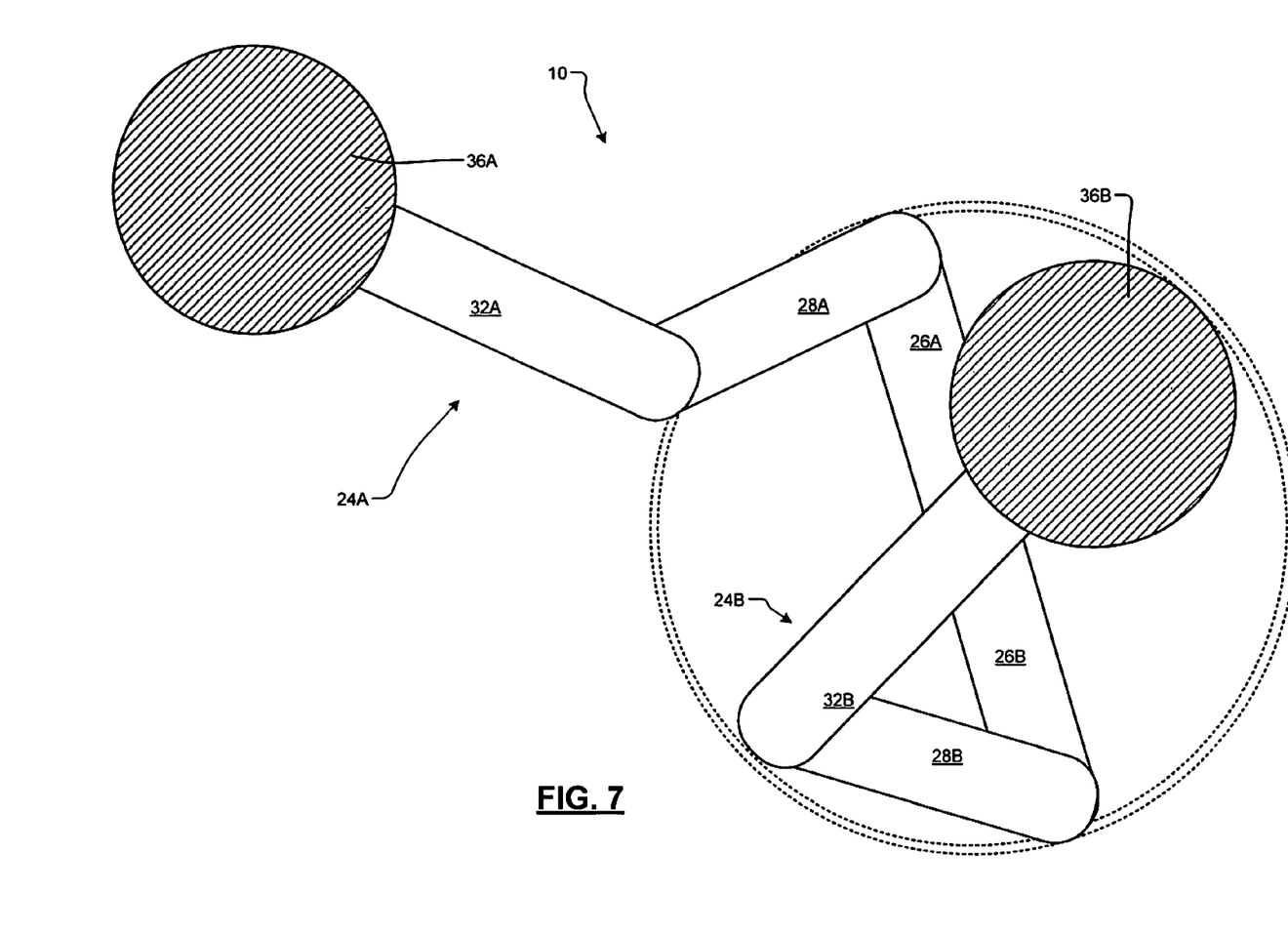

In FIG. 5, the first arm 24A is shown in a first partially extended position. Note that the first arm 24A extended without allowing the substrates 36A and 36B to pass over each other. In FIG. 6, the first arm 24A is shown in a second partially extended position. In FIG. 7, the first arm 24A is shown in a fully extended position. Note that the first arm 24A extended without allowing the substrates 36A and 36B to pass over each other. As can be appreciated, both the first and second arms may be moved at the same times or different times.

Figure 8:
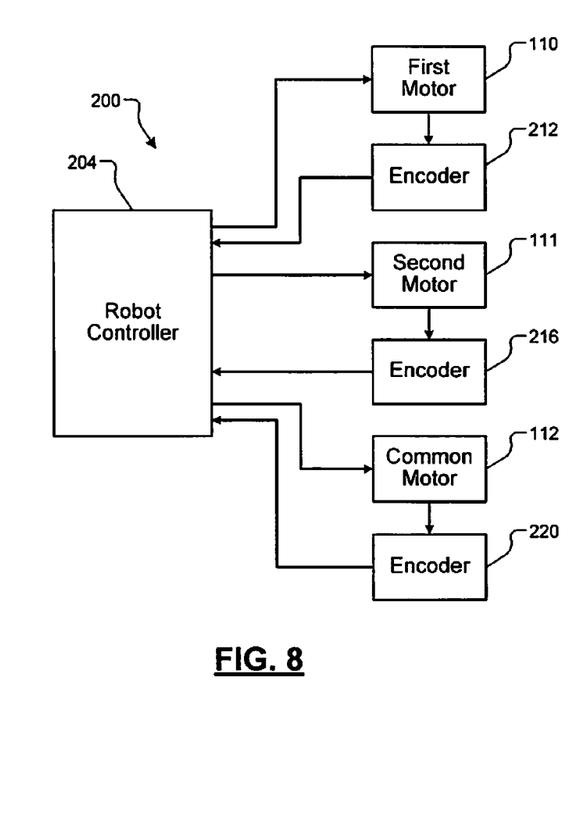
FIG. 8 is a functional block diagram of a controller configured to control the arms of the robot according to the present disclosure.

Referring now to FIG. 8, a control system 200 for the robot arm includes a robot controller 204 that controls movement of the first motor 107, the second motor 108, and a common motor 109. Encoder 212 determines a position of the first motor 101. Encoder 216 determines a position of the second motor 111. Encoder 220 determines a position of the common motor 109. Some examples, one or more of the encoders are absolute numerical encoders.

Figure 9:
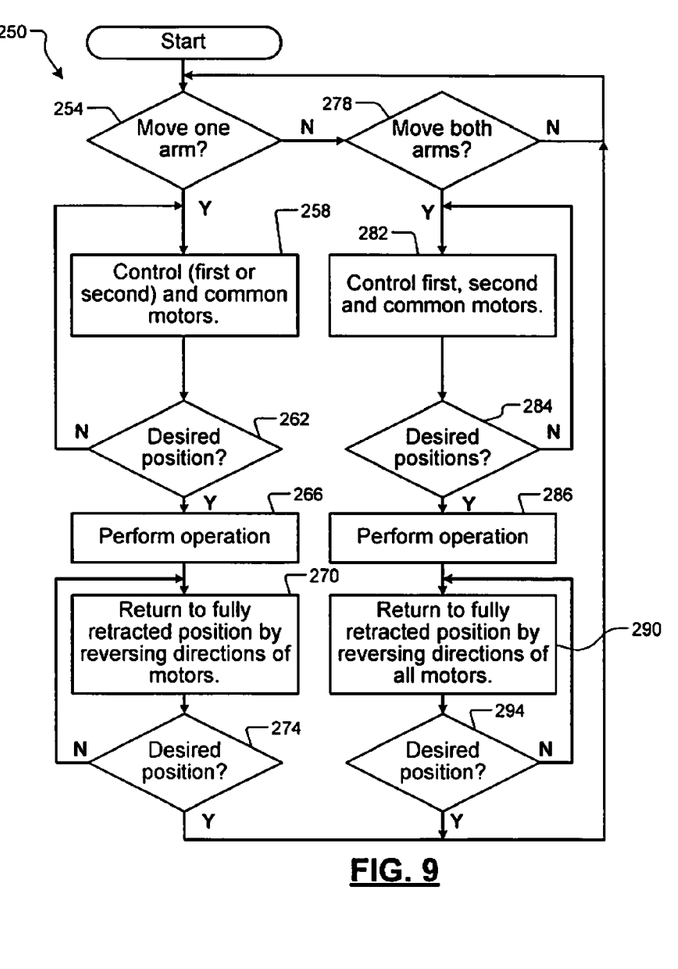
FIG. 9 is a flowchart illustrating a method for controlling the arms of the robot according to the present disclosure.

Referring now to FIG. 9, an example of a method 250 for controlling the robot arm is shown. At 254, a controller determines whether one arm or both arms need to be moved. If one arm needs to be moved, control continues at 258 where the controller controls the first, second and common motors. In some examples, the controller rotates the first (or second) motor corresponding to the desired arm to be moved and the common motor. The second (or first) motor corresponding to the arm that is not moved may be rotated in an opposite direction so that the non-selected arm remains in a fully retracted position and the first arm portions 26A and 26B rotate together and remain generally co-linear.

At 262, control determines whether the selected arm has reached a desired position. If not, control continues with 258. At 266, control optionally performs an operation with the end effector such as picking up or leaving a substrate in a processing chamber. At 270, after the operation is performed, the selected arm is returned to a fully retracted position by reversing directions of all motors. At 274, control determines whether the selected arm is in a desired position. If true, control returns to 254. If false, control returns to 270.

If both arms need to be moved at 278, control continues at 282. The controller controls the first, second and common motors. For example, the controller may rotate the first, second and common motors in the same direction so that both arms move in opposite directions.

At 284, control determines whether the selected arms have reached their corresponding desired positions. If not, control continues with 282. At 286, control optionally performs an operation with one or both of the end effectors such as picking up or leaving a substrate in a processing chamber. At 290, after the operation is performed, the selected arm may be returned to a fully retracted position by reversing directions of all motors. At 274, control determines whether the selected arms are in the fully retracted position. If true, control returns to 254. If false, control returns to 270.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A dual arm robot for a substrate processing system, comprising:
   a base;
   a first arm having extended and retracted positions and including:
      a first arm portion having one end rotatably connected to the base;
      a second arm portion having one end rotatably connected to another end of the first arm portion; and
      an end effector having one end rotatably connected to another end of the second arm portion and another end configured to support a first substrate; and
   a second arm having extended and retracted positions including:
      a first arm portion having one end rotatably connected to the base;
      a second arm portion having one end rotatably connected to another end of the first arm portion; and
      an end effector having one end rotatably connected to another end of the second arm portion and another end configured to support a second substrate,
      wherein when the first and second arms are arranged in the retracted position:
      a connection between the second arm portion of the first arm and the end effector of the first arm is located directly above the second substrate;
      a connection between the second arm portion of the second arm and the end effector of the second arm is located directly under the first substrate; and
      the first substrate is not located over the second substrate.

2. A dual arm robot for a substrate processing system, comprising:
   a base;
   a first arm having extended and retracted positions and including:
      a first arm portion having one end rotatably connected to the base;
      a second arm portion having one end rotatably connected to another end of the first arm portion; and
      an end effector having one end rotatably connected to another end of the second arm portion and another end configured to support a first substrate; and
   a second arm having extended and retracted positions including:
      a first arm portion having one end rotatably connected to the base;
      a second arm portion having one end rotatably connected to another end of the first arm portion; and
      an end effector having one end rotatably connected to another end of the second arm portion and another end configured to support a second substrate,
      wherein when the first and second arms are arranged in the retracted position:
      a connection between the second arm portion of the first arm and the end effector of the first arm is located over the second substrate;
      a connection between the second arm portion of the second arm and the end effector of the second arm is located under the first substrate; and
      the first substrate is not located over the second substrate,
      wherein the first substrate does not pass over the second substrate as at least one of the first arm or the second arm moves between the retracted position and the extended position.

3. A dual arm robot for a substrate processing system, comprising:
   a base;
   a first arm having extended and retracted positions and including:
      a first arm portion having one end rotatable connected to the base;
      a second arm portion having one end rotatable connected to another end of the first arm portion; and
      an end effector having one end rotatable connected to another end of the second arm portion and another end configured to support a first substrate; and
   a second arm having extended and retracted positions including:
      a first arm portion having one end rotatably connected to the base;
      a second arm portion having one end rotatable connected to another end of the first arm portion; and
      an end effector having one end rotatable connected to another end of the second arm portion and another end configured to support a second substrate,
      wherein when the first and second arms are arranged in the retracted position:
      a connection between the second arm portion of the first arm and the end effector of the first arm is located over the second substrate;
      a connection between the second arm portion of the second arm and the end effector of the second arm is located under the first substrate; and
      the first substrate is not located over the second substrate,
      wherein when the first arm portion of the first arm and the first arm portion of the second arm are in retracted position, (i) the first arm portion of the first arm and the first arm portion of the second arm are co-linear, and (ii) circumferential outer edges of the first substrate and the second substrate are located within a circle defined by radially outermost portions of the first arm portion of the first arm and the first arm portion of the second arm.

4. A dual arm robot for a substrate processing system, comprising:
   a base;
   a first arm having extended and retracted positions and including:
      a first arm portion having one end rotatably connected to the base;
      a second arm portion having one end rotatable connected to another end of the first arm portion; and
      an end effector having one end rotatably connected to another end of the second arm portion and another end configured to support a first substrate; and
   a second arm having extended and retracted positions including:
      a first arm portion having one end rotatably connected to the base;
      a second arm portion having one end rotatably connected to another end of the first arm portion; and
      an end effector having one end rotatably connected to another end of the second arm portion and another end configured to support a second substrate,
      wherein when the first and second arms are arranged in the retracted position:
      a connection between the second arm portion of the first arm and the end effector of the first arm is located over the second substrate;
      a connection between the second arm portion of the second arm and the end effector of the second arm is located under the first substrate;
      the first substrate is not located over the second substrate; and
      a drive mechanism configured to couple rotation of the first arm portion of the first arm relative to the base in a first rotational direction to rotation of (i) the second arm portion of the first arm relative to the first arm portion of the first arm in a second rotational direction opposite to the first rotational direction and (ii) rotation of the end effector of the first arm relative to the second arm portion of the first arm in the first rotational direction.

5. The dual arm robot of claim 4, wherein the drive mechanism is further configured to couple rotation of the first arm portion of the second arm relative to the base in the second rotational direction to rotation of (i) the second arm portion of the second arm relative to the first arm portion of the second arm in the first rotational direction and (ii) rotation of the end effector of the second arm relative to the second arm portion of the second arm in the second rotational direction.

6. The dual arm robot of claim 4, wherein the drive mechanism includes:
a first motor;
a second motor; and
a common motor,
wherein rotation of the first motor extends and retracts the first and second arms relative to the base, rotation of the first motor and the second motor allows extension and retraction of the first arm or the second arm relative to the base, and rotation of the common motor rotates the first arm and the second arm relative to the base without extension or retraction.

7. The dual arm robot of claim 6, wherein the drive mechanism includes:
one or more pulleys and one or more drive belts to:
rotationally couple rotation of the first arm portion of the first arm, the second arm portion of the first arm and the end effector of the first arm; and
rotationally couple rotation of the first arm portion of the second arm, the second arm portion of the second arm and the end effector of the second arm.

8. The dual arm robot of claim 5, wherein when the drive mechanism rotates the first arm portion of the first arm by a first angle relative to the base, the drive mechanism (i) rotates the second arm portion of the first arm by a second angle relative to the first arm portion of the first arm and (ii) rotates the end effector of the first arm by a third angle relative to the second arm portion of the first arm.

9. The dual arm robot of claim 8, wherein a magnitude of the first angle is greater than a magnitude of the second angle, and the magnitude of the second angle is greater than a magnitude of the third angle.

10. The dual arm robot of claim 9, wherein the magnitude of the second angle is one half of the magnitude of the first angle and the magnitude of the third angle is one half of the magnitude of the second angle.

11. The dual arm robot of claim 1, wherein the first arm extends in an opposite direction than the second arm.

12. The dual arm robot of claim 5, wherein when the drive mechanism rotates the first arm portion of the second arm by a first angle relative to the base, the drive mechanism (i) rotates the second arm portion of the second arm by a second angle relative to the first arm portion of the second arm and (ii) rotates the end effector of the second arm by a third angle relative to the second arm portion of the second arm.

13. The dual arm robot of claim 12, wherein a magnitude of the first angle is greater than a magnitude of the second angle, and the magnitude of the second angle is greater than a magnitude of the third angle.

14. The dual arm robot of claim 13, wherein the magnitude of the second angle is one half of the magnitude of the first angle and the magnitude of the third angle is one half of the magnitude of the second angle.

* * * * *